United States Patent
Vos et al.

(10) Patent No.: US 7,324,336 B2
(45) Date of Patent: Jan. 29, 2008

(54) FLOW THROUGH COOLING ASSEMBLIES FOR CONDUCTION-COOLED CIRCUIT MODULES

(75) Inventors: David L. Vos, Apalachin, NY (US); Randall J. Stutzman, Vestal, NY (US); Jon Larcheveque, Owego, NY (US); Eugene J. Urda, Binghamton, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 100 days.

(21) Appl. No.: 11/236,471

(22) Filed: Sep. 27, 2005

(65) Prior Publication Data

US 2007/0070601 A1 Mar. 29, 2007

(51) Int. Cl.
*H05K 7/20* (2006.01)
(52) U.S. Cl. ............ 361/694; 361/690; 361/692; 361/714; 361/715; 165/80.3; 165/104.33
(58) Field of Classification Search ............ 361/687, 361/690–700, 707–714, 715–719, 720–727; 165/139, 149, 80.3, 80.4, 122, 185, 80.5, 165/104.33; 257/706–727; 62/259.2; 174/15.1, 174/16.1, 16.3
See application file for complete search history.

(56) References Cited

U.S. PATENT DOCUMENTS

| | | | | |
|---|---|---|---|---|
| 3,648,113 A | * | 3/1972 | Rathjen et al. | 361/707 |
| 3,956,673 A | * | 5/1976 | Seid | 361/690 |
| 4,006,388 A | * | 2/1977 | Bartholomew | 361/691 |
| 4,186,422 A | | 1/1980 | Laermer | |
| 4,442,475 A | * | 4/1984 | Franklin et al. | 361/690 |
| 4,829,402 A | * | 5/1989 | Gewebler et al. | 361/692 |
| 5,019,939 A | | 5/1991 | Reimer | |
| 5,034,852 A | * | 7/1991 | Rosenberg | 361/690 |
| 5,420,753 A | | 5/1995 | Akamatsu et al. | |
| 5,424,916 A | * | 6/1995 | Martin | 361/698 |
| 5,482,109 A | * | 1/1996 | Kunkel | 165/80.3 |
| 5,825,621 A | * | 10/1998 | Giannatto et al. | 361/701 |
| 5,910,884 A | | 6/1999 | Garza et al. | |
| 5,940,266 A | | 8/1999 | Hamilton et al. | |
| 6,052,284 A | | 4/2000 | Suga et al. | |

(Continued)

OTHER PUBLICATIONS

IBM "*Cold Plate for Thermal Conduction Module With Reduced Water Flow Resistance, Increase Fin Area, And Improved Water Turbulence*" Technical Disclosure Bulletin vol. 29, No. 2, Jul. 1986, pp. 689-690.

(Continued)

*Primary Examiner*—Michael Datskovskiy
(74) *Attorney, Agent, or Firm*—Wolf, Greenfield & Sacks, P.C.

(57) ABSTRACT

A cooling assembly is located in a chassis with a conduction-cooled circuit module and permits the conduction-cooled circuit module to be utilized in an air-flow-through or liquid-flow-through circuit module chassis assembly. The cooling assembly may be a removable cooling adapter or may be integral with the chassis. The cooling assembly includes a housing having a first end and a second end and defining one or more fluid passages. The housing further includes a thermal contact surface to contact the conduction-cooled circuit module. The cooling assembly may be configured for air-flow-through or liquid-flow-through cooling of the conduction-cooled circuit module.

17 Claims, 7 Drawing Sheets

U.S. PATENT DOCUMENTS

| | | |
|---|---|---|
| 6,055,157 A | 4/2000 | Bartilson |
| 6,058,010 A | 5/2000 | Schmidt et al. |
| 6,212,075 B1 | 4/2001 | Habing et al. |
| 6,272,012 B1 | 8/2001 | Medin et al. |
| 6,304,447 B1 | 10/2001 | Bortolini et al. |
| 6,366,461 B1 | 4/2002 | Pautsch et al. |
| 6,381,147 B1 | 4/2002 | Hayward et al. |
| 6,404,640 B1 | 6/2002 | Ishimine et al. |
| 6,430,044 B2 | 8/2002 | Hutchinson et al. |
| 6,462,949 B1 | 10/2002 | Parish, IV et al. |
| 6,483,700 B1 | 11/2002 | Malone et al. |
| 6,496,375 B2 | 12/2002 | Patel et al. |
| 6,621,706 B2 | 9/2003 | Tzlil et al. |
| 6,768,642 B2 | 7/2004 | Hines et al. |
| 6,776,221 B2 | 8/2004 | Montgomery et al. |
| 6,781,831 B1 | 8/2004 | Banton et al. |
| 6,796,372 B2 | 9/2004 | Bear |

OTHER PUBLICATIONS

IBM "*High-Power Electronic Package*" Technical Disclosure Bulletin, vol. 20, No. 11A, Apr. 1978, pp. 4393-4398.

Draft Standard entitled "*Mechanical Specifications for Microcomputers Using Enhanced Ruggedized Design Implementation (ERDI)*", VITA 48.0, Revision D0.1a, Jul. 14, 2004, VITA Standards Organization, Fountain Hills, AZ, pp. 1-33.

\* cited by examiner

FLOW THROUGH COOLING ASSEMBLIES FOR CONDUCTION-COOLED CIRCUIT MODULES

FIELD OF THE INVENTION

This invention relates to circuit module chassis assemblies wherein circuit modules are mounted in a chassis and, more particularly, to cooling assemblies that permit conduction-cooled circuit modules to be used in circuit module chassis assemblies that are designed for air-flow-through cooling or liquid-flow-through cooling.

BACKGROUND OF THE INVENTION

Circuit module chassis assemblies which include multiple circuit modules mounted in a chassis are widely used in electronic applications. A circuit module chassis assembly may include a chassis configured to mechanically support the circuit modules, electrical connectors to interconnect the circuit modules, power supplies for operation of the circuit modules and one or more external connectors to connect the circuit module assembly to external equipment. The circuit module chassis assemblies are widely used in military and aircraft applications, but are not limited to such applications. Circuit module chassis assemblies for military applications must be designed to operate reliably in harsh environments.

The circuit module chassis assemblies typically require a cooling system to remove heat generated by the circuit components and to maintain the circuit modules within a specified temperature range. Various cooling techniques are utilized, including conduction cooling, air-flow-through cooling and liquid-flow-through cooling. By way of example, conduction cooling may be used up to 70 watts heat generation, air-flow-through cooling may be used up to 250 watts heat generation, and liquid-flow-through cooling may be used up to 1000 watts heat generation. The trend is toward circuit modules which have higher speed and higher performance, but which generate larger amounts of heat.

A problem arises in that the three cooling approaches are incompatible in the circuit module chassis assembly. Conduction-cooled circuit modules typically conduct heat to the sidewalls of the chassis, and the side walls are provided with heat exchanger fins for heat dissipation. By contrast, air-flow-through and liquid-flow-through chasses do not have heat exchangers in the sidewalls. Instead, the sidewalls of the chassis are used for coolant distribution. Accordingly, a conduction-cooled circuit module previously could not be mounted in a chassis that is designed for air-flow-through cooling or liquid-flow-through cooling. The chassis could be designed to have a conduction-cooled section and an air-cooled or liquid-cooled section. However, this approach limits the application of the chassis to a fixed number of conduction-cooled circuit modules and a fixed number of air-cooled or liquid-cooled circuit modules, thereby reducing the flexibility of the design.

Accordingly, there is a need for cooling assemblies which permit conduction-cooled circuit modules to be utilized in chasses that are designed for air-flow-through or liquid-flow-through cooling.

SUMMARY OF THE INVENTION

According to a first aspect of the invention, a cooling adapter is provided for operation with a conduction-cooled circuit module. The cooling adapter mounts in a chassis with the conduction-cooled circuit module and permits the conduction-cooled circuit module to be utilized in an air-flow-through or liquid-flow-through circuit module chassis assembly.

The cooling adapter comprises an adapter housing having a first end and a second end and defining one or more fluid passages between the first and second ends, the adapter housing further including a thermal contact surface to contact a conduction-cooled circuit module. The cooling adapter further includes an inlet, located at the first end and coupled to the fluid passages, to receive a cooling fluid, and an outlet, located at the second end and coupled to the fluid passages, to exhaust the cooling fluid from the adapter.

In some embodiments, the adapter housing is configured for air-flow-through cooling. The inlet and the outlet may be configured to engage a chassis plenum for receiving and exhausting cooling air. In other embodiments, the adapter housing is configured for liquid-flow-through cooling. The inlet and the outlet may be configured to engage fluid connectors.

The adapter housing may be provided with ribs that are in thermal contact with the circuit module. The adapter housing also may be provided with heat exchanger fins that conduct thermal energy from the thermal contact surface to the cooling fluid.

According to a second aspect of the invention, a circuit module chassis assembly is provided for operation with a conduction-cooled circuit module. The circuit module chassis assembly comprises a chassis including a first sidewall and a second sidewall, a cooling assembly in the chassis, and a cooling fluid source coupled to the cooling assembly. The cooling assembly comprises a housing having a first end engaging the first sidewall of the chassis and a second end engaging the second sidewall of the chassis, the housing defining one or more fluid passages between the first and second ends and further including a thermal contact surface to contact the conduction-cooled circuit module. The cooling assembly further comprises an inlet, located at the first end and coupled to the fluid passages, to receive a cooling fluid, and an outlet, located at the second end and coupled to the fluid passages, to exhaust the cooling fluid from the cooling assembly.

In some embodiments, the cooling assembly comprises a cooling adapter that is removable from the chassis. In other embodiments, the cooling assembly is an integral part of the chassis. The cooling assembly may be configured for air-flow-through cooling or for liquid-flow-through cooling.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
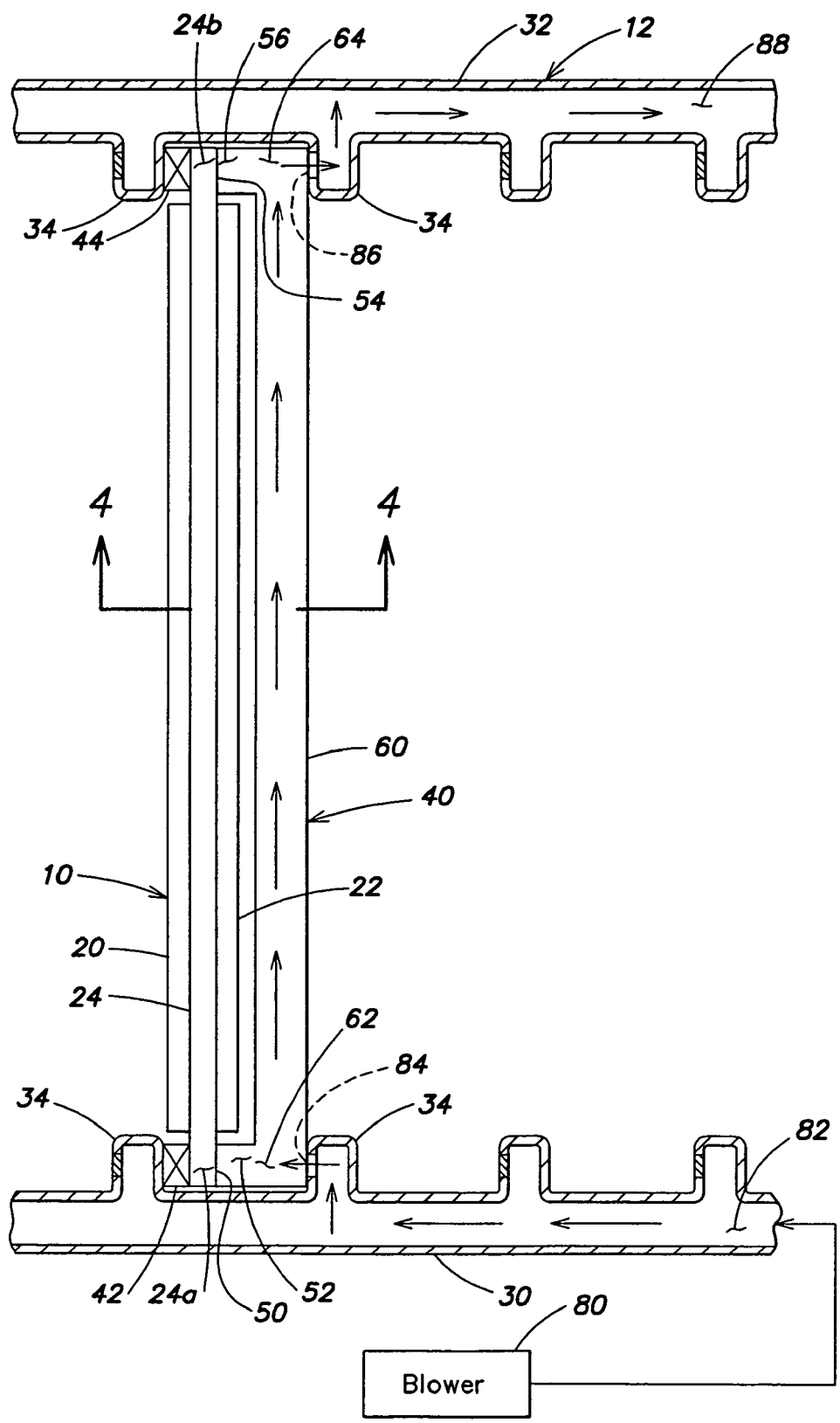
FIG. 1 is a simplified partial top view of a circuit module chassis assembly in accordance with a first embodiment of the invention.
Figure 2:
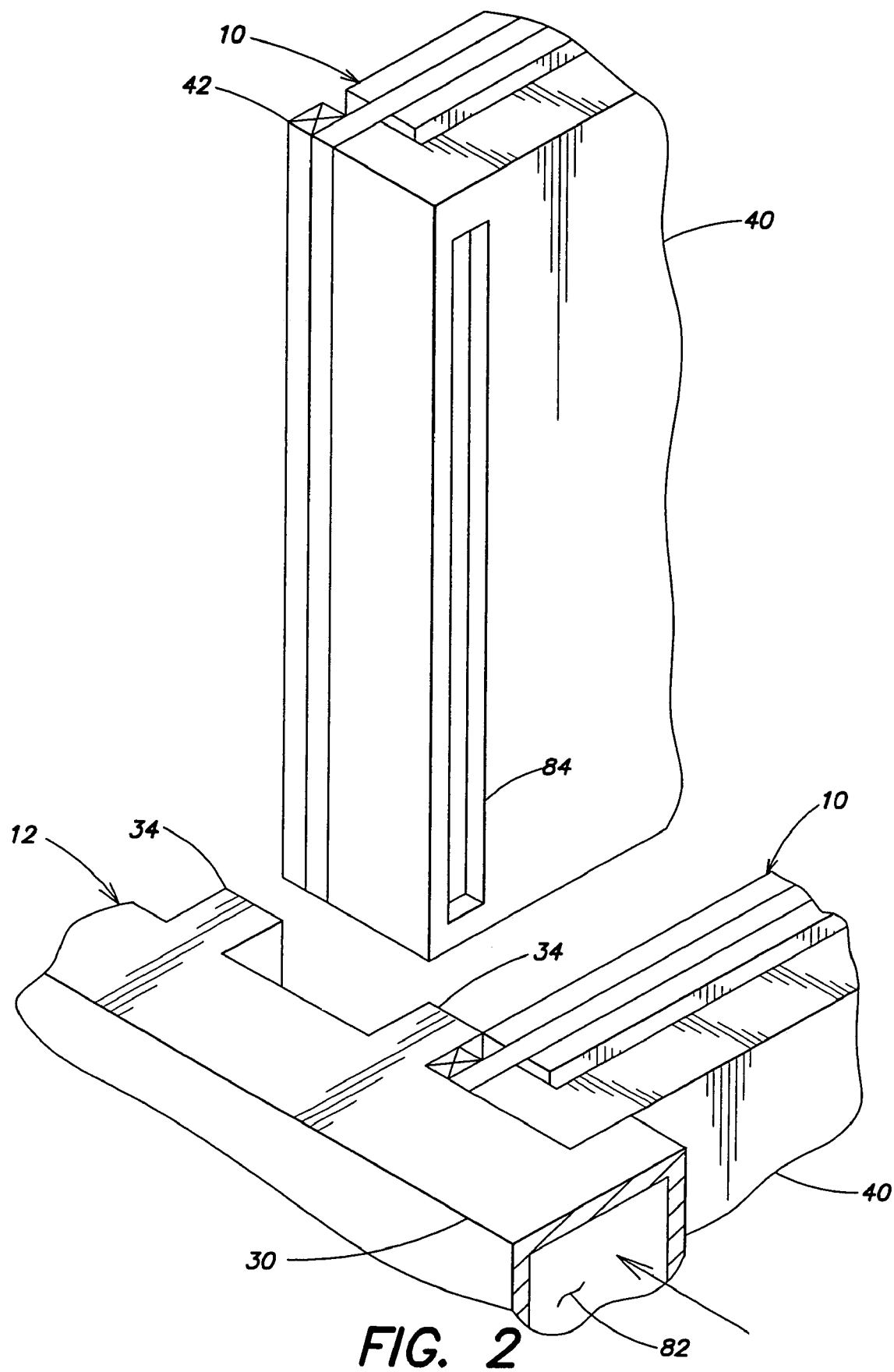
FIG. 2 is a partial perspective view of the circuit module chassis assembly, with a conduction-cooled circuit module and a cooling adapter removed for illustration.
Figure 3:
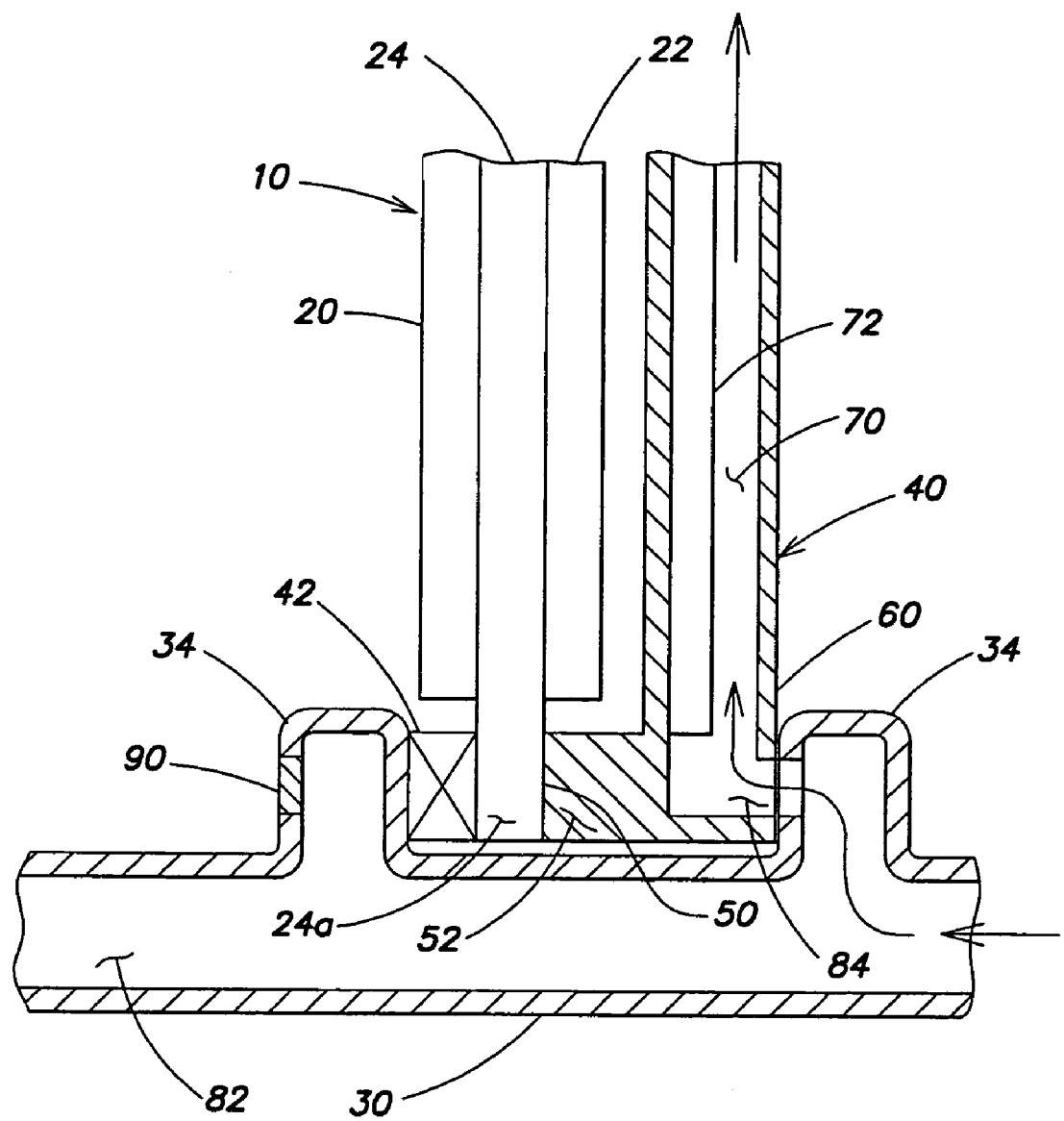
FIG. 3 is a simplified top view of one side of the circuit module chassis assembly of FIG. 1.

A circuit module chassis assembly in accordance with a first embodiment of the invention shown in FIGS. 1-4. A simplified partial top view of the circuit module chassis assembly is shown in FIG. 1. A conduction-cooled circuit module 10 is mounted in a chassis 12. Chassis 12 may be configured to hold 15 to 20 circuit modules, for example, one of which is shown in FIG. 1.

Circuit module 10 may include a circuit card 20 and a circuit card 22 mounted to a thermally conductive plate 24, which may be aluminum. Each of circuit cards 20 and 22 may include integrated circuits and other electrical components mounted on a printed wiring board. In various embodiments, circuit module 10 may include circuit card 20, circuit card 22, or both. Each of circuit cards 20 and 22 includes a connector 26 (FIG. 4) for engaging a connector of chassis 12. Thermally conductive plate 24 includes extensions 24a and 24b beyond circuit cards 20 and 22, which define surfaces 50 and 54, respectively, for thermal transfer by conduction. Conduction-cooled circuit module 10 may be of conventional design.

The detail of chassis 12 is omitted for simplicity. In general, chassis 12 is configured as a box for supporting multiple circuit modules and may include edge connectors for interconnecting the circuit modules. The chassis may also provide mounting for one or more power supplies for operation of the circuit modules and one or more connectors for connection to external equipment. The configuration of the chassis may vary according to application. The chassis may be configured for different circuit modules in different applications.

As shown in FIG. 1, chassis 12 includes a first sidewall 30 and a second sidewall 32. Each of sidewalls 30 and 32 includes spaced-apart rails 34 which define mounting locations for circuit module 10 and additional circuit modules (not shown). In the embodiment of FIGS. 1-4, each of sidewalls 30 and 32 is hollow to define a plenum for circulation of cooling air.

As further shown in FIG. 1, the circuit module chassis assembly includes an air-flow-through cooling adapter 40 mounted in chassis 12 in proximity to circuit module 10. In particular, cooling adapter 40 and conduction-cooled circuit module 10 are mounted between adjacent rails 34 of sidewalls 30 and 32. In the embodiment of FIGS. 1-4, cooling adapter 40 and circuit module 10 are secured between adjacent rails 34 of sidewalls 30 and 32 by mounting hardware in the form of wedge-lock fasteners 42 and 44. Fasteners 42 and 44 establish a pressure connection between circuit module 10, cooling adapter 40, and rails 34.

Cooling adapter 40 includes an adapter housing 60 having a first end 62 that engages rail 34 of sidewall 30 and one side of circuit module 10, and a second end 64 that engages rail 34 of sidewall 32 and the opposite side of circuit module 10. In particular, first end 62 of adapter housing 60 includes a rib 52 which is pressed against contact surface 50 of plate 24, and second end 64 includes a rib 56 which is pressed against contact surface 54 of plate 24. Ribs 52 and 56 extend from a main body of adapter housing 60 toward plate 24 and serve to space the main body of adapter housing 60 from circuit module 10. Ribs 52 and 56 have thermal transfer surfaces that contact plate 24 of circuit module 10.

Thermal energy generated by circuit cards 20 and 22 is transferred through plate 24 to extensions 24a and 24b of plate 24. The thermal energy is then transferred through surfaces 50 and 54 of extensions 24a and 24b to ribs 52 and 56 of cooling adapter 40.

Figure 4:
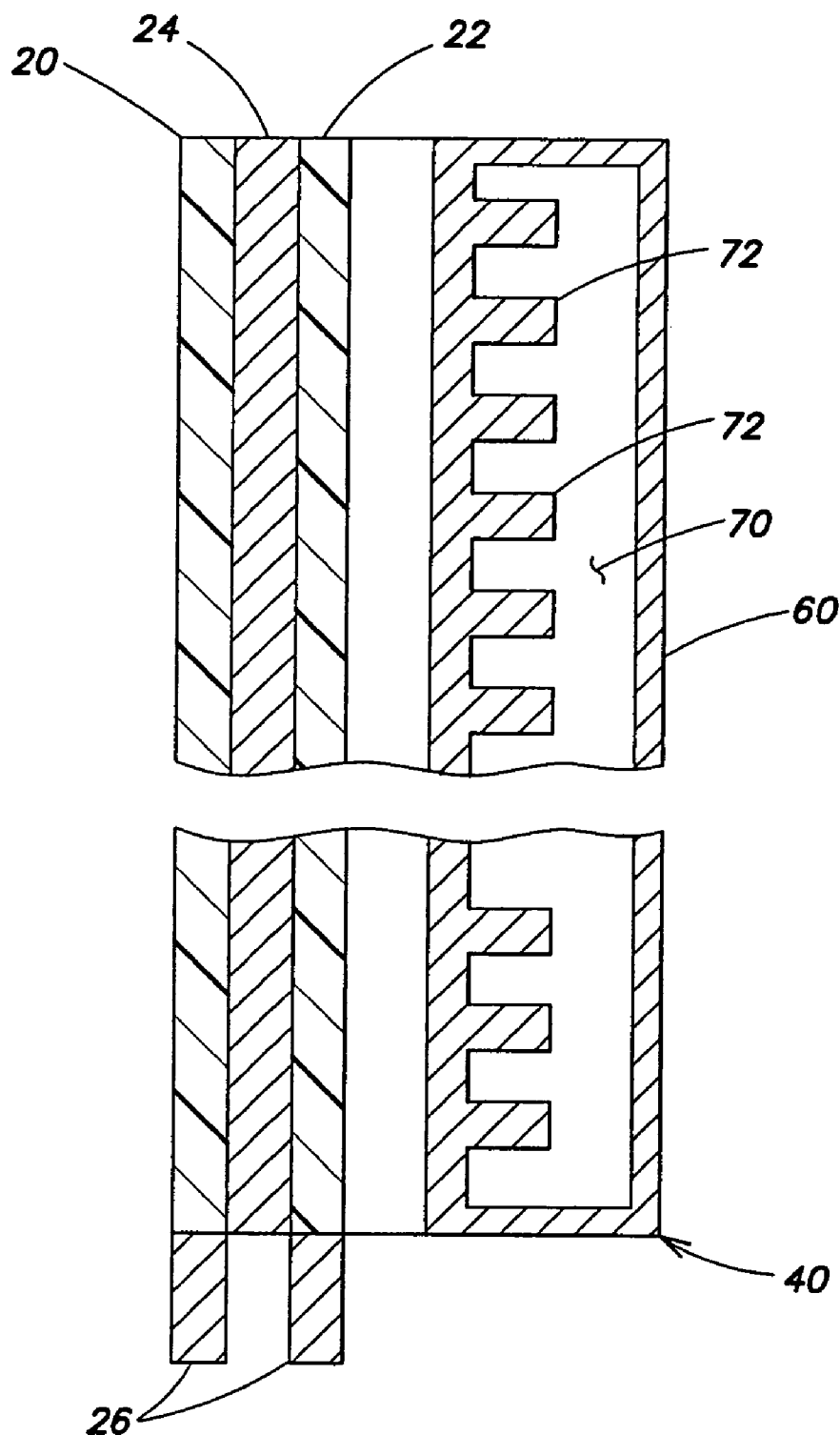
FIG. 4 is a cross-sectional view of the conduction-cooled circuit module and cooling adapter, taken along the line 4-4 of FIG. 1.

As best shown in FIG. 4, adapter housing 60 defines at least one fluid passage 70 between first end 62 and second end 64 of cooling adapter 40. In the embodiment of FIG. 4, adapter housing 60 includes heat exchanger fins 72 that extend into passage 70 and enhance thermal transfer to the cooling fluid. Heat exchanger fins 72 may be constructed by various methods and may have various configurations, such as machined fins, brazed fins, bonded fins, convoluted fins, straight fins, wavy fins, lanced offset fins, or custom shaped fins. In other embodiments, adapter housing 60 may have two or more separate fluid passages. The thermal energy from circuit module 10 is transferred by conduction from ribs 52 and 56 to heat exchanger fins 72 and then to the cooling fluid in passage 70.

A blower 80 (FIG. 1) may supply cooling air through a plenum 82 in sidewall 30 and rail 34 to an inlet 84 of adapter housing 60. The cooling air passes through fluid passage 70 and over heat exchanger fins 72 to outlet 86 and is exhausted through a plenum 88 in sidewall 32. In unused locations, plenum 82 in rail 34 may be provided with a cover 90.

Another option for cooling air is to use an environmental conditioning system located elsewhere on the vehicle. Additionally, the chassis may be installed on the high-pressure side (e.g. blower side) of the cooling system as shown in FIG. 1 or on the low-pressure side (e.g. vacuum side) of the cooling system. Furthermore, the cooling system may be open loop to the ambient air, as shown in FIG. 1, or may be closed loop with the exhaust air being recycled through the environmental conditioning system.

Figure 5:
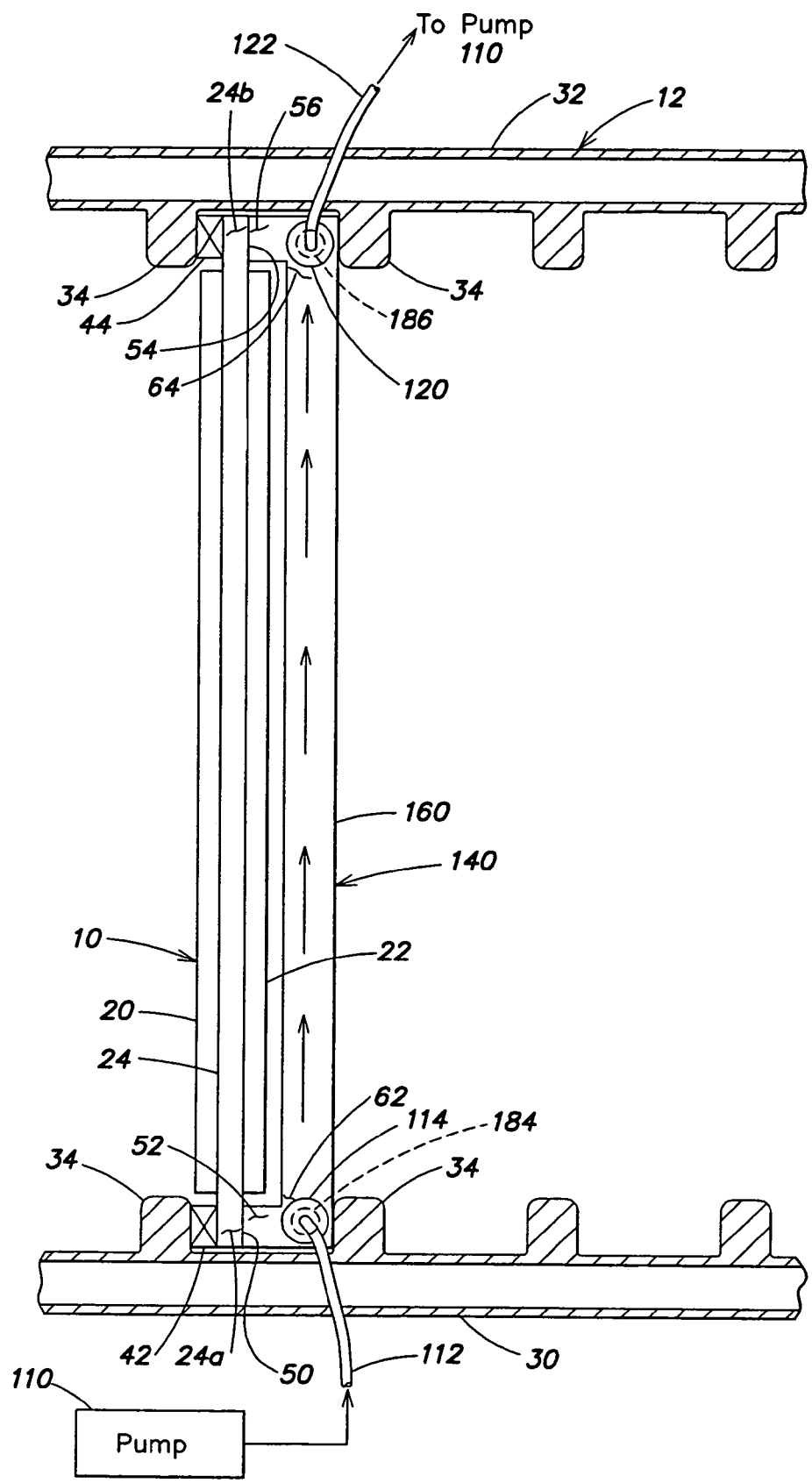
FIG. 5 is a simplified partial top view of a circuit module chassis assembly in accordance with a second embodiment of the invention.
Figure 6:
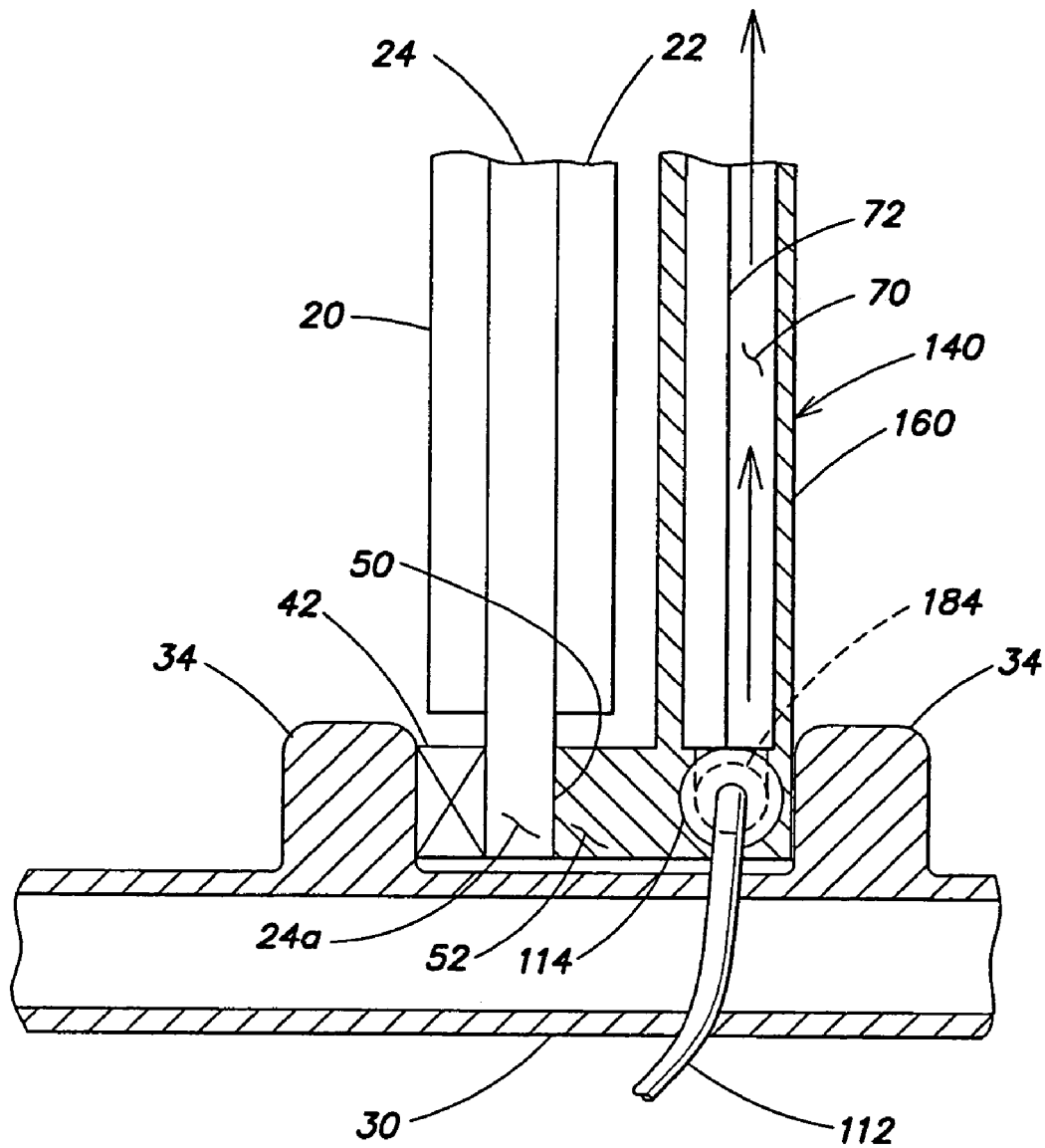
FIG. 6 is a simplified top view of one side of the circuit module chassis assembly of FIG. 5.

A circuit module chassis assembly in accordance with a second embodiment of the invention is shown in FIGS. 5 and 6. A simplified partial top view of the circuit module chassis assembly is shown in FIG. 5. Like elements in FIGS. 1-6 have the same reference numerals.

As in the embodiment of FIGS. 1-4, conduction-cooled circuit module 10 is mounted in chassis 12. Chassis 12 includes first sidewall 30 and second sidewall 32, each of which includes spaced-apart rails 34 that define mounting locations for circuit module 10 and additional circuit modules (not shown).

The circuit module chassis assembly further includes a liquid-flow-through cooling adapter 140 mounted in chassis 12 in proximity to circuit module 10. Cooling adapter 140 and circuit module 10 are secured between adjacent rails 34 of sidewalls 30 and 32 by mounting hardware in the form of wedge-lock fasteners 42 and 44. Fasteners 42 and 44 establish a pressure connection between circuit module 10, cooling adapter 140, and rails 34.

Cooling adapter 140 includes an adapter housing 160 having first end 62 that engages rail 34 of sidewall 30 and one side of circuit module 10, and second end 64 that engages rail 34 of sidewall 32 and the opposite side of circuit module 10. Cooling adapter 140 is provided with ribs 52 and 56 that are pressed against surfaces of thermally conductive plate 24 and provide a path for transfer of thermal energy. Rib 52 of adapter housing 160 is pressed against contact surface 50 of plate 24, and rib 56 of adapter housing 160 is pressed against contact surface 54 of plate 24. Thermal energy generated by circuit cards 20 and 22 is transferred through plate 24 to extensions 24a and 24b of plate 24. The thermal energy is then transferred through surfaces 50 and 54 of extensions 24a and 24b to ribs 52 and 56 of cooling adapter 140.

A pump 110 (FIG. 5) may supply a cooling liquid through a tube or manifold 112 and a connector 114 to an inlet 184 of cooling adapter 140. The cooling liquid passes through fluid passage 70 and over heat exchanger fins 72 to an outlet 186 of cooling adapter 140. Heat exchanger fins 72 may be constructed by various methods and may have various configurations, such as machined fins, brazed fins, bonded fins, convoluted fins, straight fins, wavy fins, lanced offset fins, or custom shaped fins. The cooling liquid is exhausted through a connector 120 and a tube or manifold 122 and is returned to pump 110 to form a closed-loop recirculating liquid cooling system.

In the embodiments of FIGS. 1-6, conduction-cooled circuit module 10 is utilized in chassis 12 and is cooled through contact surfaces 50 and 54. However, conduction-cooled circuit module 10 does not rely upon chassis 12 for conduction cooling. Instead, cooling adapter 40 provides air cooling or cooling adapter 140 provides liquid cooling of circuit module 10. Thus, circuit module 10 can be utilized without modification in a chassis that is designed for air-flow-through cooling or liquid-flow-through cooling. In addition, the cooling adapters 40 and 140 are removable from chassis 12 and can be positioned in different slots in chassis 12 as needed.

Figure 7:
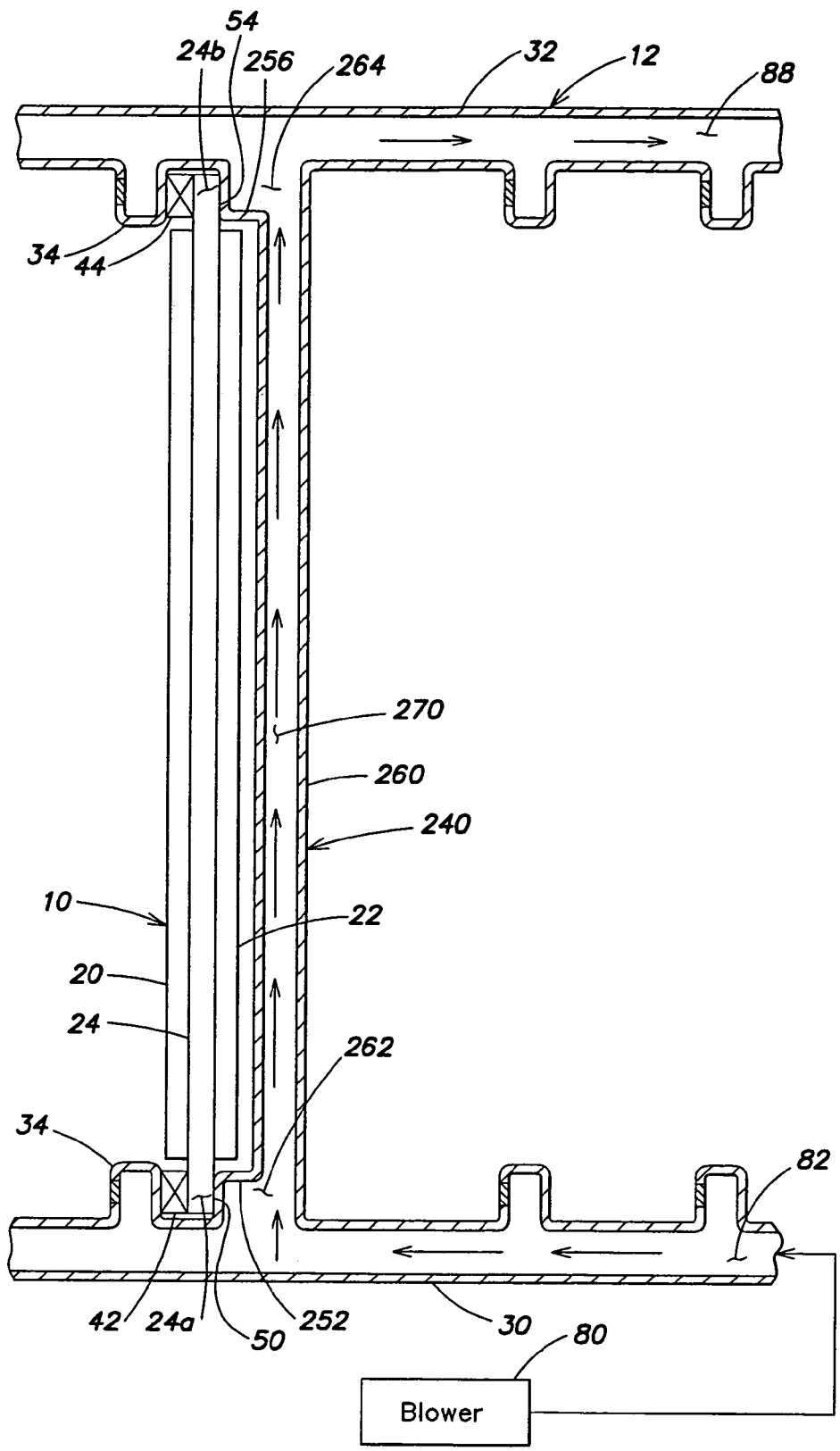
FIG. 7 is a simplified partial top view of a circuit module chassis assembly in accordance with a third embodiment of the invention.

A circuit module chassis assembly in accordance with a third embodiment of the invention is shown in FIG. 7. Like elements in FIGS. 1-7 have the same reference numerals.

As in the embodiment of FIGS. 1-4, conduction-cooled circuit module 10 is mounted in chassis 12. Chassis 12 includes first sidewall 30 and second sidewall 32, each of which includes spaced apart rails 34 that define mounting locations for circuit module 10 and additional circuit modules (not shown).

The circuit module chassis assembly further includes a cooling assembly 240 in chassis 12 in proximity to circuit module 10. Circuit module 10 is secured between rail 34 and cooling assembly 240 by mounting hardware in the form of wedge lock fasteners 42 and 44. Fasteners 42 and 44 establish a pressure connection between circuit module 10, cooling assembly 240, and rails 34.

Cooling assembly 240 includes a housing 260 having a first end 262 secured to sidewall 30 and a second end 264 secured to sidewall 32. In the embodiment of FIG. 7, cooling assembly 240 is an integral part of chassis 12. Cooling assembly 240 is provided with ribs 252 and 256 that contact surfaces of thermally conductive plate 24 and provide a path for transfer of thermal energy. Rib 252 of cooling assembly 240 is pressed against contact surface 50 of plate 24, and rib 256 of cooling assembly 240 is pressed against contact surface 54 of plate 24. Thermal energy generated by circuit cards 20 and 22 is transferred through plate 24 to extensions 24a and 24b of plate 24. The thermal energy is then transferred through surfaces 50 and 54 of extensions 24a and 24b to ribs 252 and 256 of cooling assembly 240.

Housing 260 of cooling assembly 240 includes at least one fluid passage 270 between first end 262 and second end 264, the fluid passage having heat exchanger fins as described above in connection with FIG. 4. Blower 80 may supply cooling air through plenum 82 in sidewall 30 to cooling assembly 240. The cooling air passes through fluid passage 270 and over the heat exchanger fins in cooling assembly 240 and is exhausted through plenum 88 in sidewall 32. As described above, another option for cooling air is to use an environmental conditioning system located elsewhere on the vehicle. Further, the chassis may be installed on the high-pressure side or the low pressure side of the cooling system. Additionally, the cooling may be open loop or may be closed loop.

In additional embodiments, an integral cooling assembly is configured for liquid-flow-through cooling. In these embodiments, the ends of the integral cooling assembly are not connected to plenum 82 in sidewall 30 and plenum 88 in sidewall 32. Instead, the ends of the integral cooling assembly are connected to a pump or other source of cooling liquid as shown in FIG. 5 and described above.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A cooling adapter for operation with a conduction-cooled circuit module, comprising:
an adapter housing having a first end and a second end and defining one or more fluid passages between the first and second end, said adapter housing further including a thermal contact surface to contact the conduction-cooled circuit module, wherein the adapter housing includes a first rib having a thermal contact surface at the first end and a second rib having a thermal contact surface at the second end;
an inlet, located at the first end and coupled to the fluid passages, to receive a cooling fluid; and
an outlet, located at the second end and coupled to the fluid passages, to exhaust the cooling fluid from the adapter.

2. A cooling adapter as defined in claim 1, wherein the adapter housing is configured for air-flow-through cooling.

3. A cooling adapter as defined in claim 2, wherein the inlet and the outlet are each configured to engage a chassis plenum for receiving and exhausting cooling air.

4. A cooling adapter as defined in claim 1, wherein the adapter housing is configured for liquid-flow-through cooling.

5. A cooling adapter as defined in claim 4, wherein the inlet and the outlet are configured to engage fluid connectors.

6. A cooling adapter as defined in claim 1, wherein the adapter housing includes heat exchanger fins to conduct thermal energy from the thermal contact surface to the cooling fluid.

7. A circuit module chassis assembly for operation with a conduction-cooled circuit module, comprising:
a chassis including spaced-apart first and second sidewalls;
a cooling assembly in the chassis, the cooling assembly comprising:
a housing having a first end that engages the first sidewall of the chassis and a second end that engages the second sidewall of the chassis, the housing defining one or more fluid passages between the first and seconds ends, the housing further including a thermal contact surface to contact the conduction-cooled circuit module, wherein the housing is provided with ribs at the first and second ends, the ribs having thermal contact surfaces to contact the conduction-cooled circuit module;

an inlet, located at the first end and coupled to the fluid passages, to receive a cooling fluid; and an outlet, located at the second end and coupled to the fluid passages, to exhaust the cooling fluid from the cooling assembly; and a cooling fluid source coupled to the inlet of the cooling assembly.

8. A circuit module chassis assembly as defined in claim 7, wherein the cooling fluid source is configured to supply air to the cooling assembly.

9. A circuit module chassis assembly as defined in claim 8, wherein the first sidewall of the chassis includes an air plenum coupled to the inlet of the cooling assembly and the second sidewall of the chassis includes an air plenum coupled to the outlet of the cooling assembly.

10. A circuit module chassis assembly as defined in claim 7, wherein the cooling fluid source is configured to supply a liquid to the cooling assembly.

11. A circuit module chassis assembly as defined in claim 10, wherein the cooling fluid source is coupled to the inlet of the cooling adapter by a first fluid connector and wherein the outlet of the cooling adapter is coupled by a second fluid connector to the cooling fluid source to form a closed-loop cooling fluid system.

12. A circuit module chassis assembly for operation with a conduction-cooled circuit module, comprising:

a chassis including spaced-apart first and second sidewalls;

a cooling assembly in the chassis, the cooling assembly comprising:

a housing having a first end secured to the first sidewall of the chassis and a second end secured to the second sidewall of the chassis, the housing defining one or more fluid passages between the first and seconds ends, the housing further including a thermal contact surface to contact the conduction-cooled circuit module, wherein the housing is provided with ribs at the first and second ends, the ribs having thermal contact surfaces to contact the conduction-cooled circuit module;

an inlet, located at the first end and coupled to the fluid passages, to receive a cooling fluid; and an outlet, located at the second end and coupled to the fluid passages, to exhaust the cooling fluid from the cooling assembly; and a cooling fluid source coupled to the inlet of the cooling assembly, wherein the cooling assembly is an integral part of the chassis.

13. A circuit module assembly as defined in claim 7, wherein the cooling assembly comprises a cooling adapter that is removable from the chassis.

14. A circuit module chassis assembly as defined in claim 7, wherein the housing includes thermal contact surfaces at the first and second ends to contact the conduction-cooled circuit module.

15. A circuit module chassis assembly as defined in claim 7, wherein the housing includes heat exchanger fins to conduct thermal energy from the thermal contact surface to the cooling fluid.

16. A circuit module chassis assembly as defined in claim 13, wherein the first and second sidewalls of the chassis each include spaced-apart rails and wherein the cooling adapter is pressed into thermal contact with the conduction-cooled circuit module between the rails of each of the sidewalls.

17. A circuit module chassis assembly as defined in claim 7, further comprising a conduction-cooled circuit module mounted in the chassis in thermal contact with the cooling assembly.

* * * * *